United States Patent
Aton

(10) Patent No.: US 6,486,525 B1
(45) Date of Patent: Nov. 26, 2002

(54) DEEP TRENCH ISOLATION FOR REDUCING SOFT ERRORS IN INTEGRATED CIRCUITS

(75) Inventor: Thomas J. Aton, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/353,478

(22) Filed: Jul. 13, 1999

Related U.S. Application Data

(60) Provisional application No. 60/092,729, filed on Jul. 14, 1998.

(51) Int. Cl.[7] .............................................. H01L 29/00
(52) U.S. Cl. ........................ 257/510; 257/513; 257/524; 257/527; 438/279; 438/296
(58) Field of Search ................................ 257/510, 511, 257/513, 524, 527; 438/221, 296, 353, 297, 258, 253, 587, 588, 424, 427, 275, 279, 199, 444, 239

(56) References Cited

U.S. PATENT DOCUMENTS

| | | | |
|---|---|---|---|
| 3,786,560 A | * 1/1974 | Cunningham | 438/412 |
| 4,510,676 A | * 4/1985 | Anantha et al. | 438/324 |
| 4,753,897 A | * 6/1988 | Lund et al. | 438/296 |
| 5,679,591 A | * 10/1997 | Lin et al. | 438/257 |
| 6,037,247 A | * 3/2000 | Anand | 438/618 |

* cited by examiner

Primary Examiner—Olik Chaudhuri
Assistant Examiner—Theresa T. Doan
(74) Attorney, Agent, or Firm—Wade James Brady, III; Frederick J. Telecky, Jr.

(57) ABSTRACT

An integrated circuit having improved soft error protection and a method improving the soft error protection of an integrated circuit are disclosed. The integrated circuit comprises a substrate 72, a transistor formed in the substrate 72, a first region 74 (e.g. a well) formed in the substrate having a first conductivity type, a second region 84 below the first region 74 having a second conductivity type, and a trench formed in the substrate having a depth at least substantially as deep as the well. The trench 70 is filled with a non-conductive material 71 that forms a frame around the transistor, whereby soft errors due to electron-hole pairs caused by ionizing radiation in the frame are substantially eliminated.

25 Claims, 4 Drawing Sheets

DEEP TRENCH ISOLATION FOR REDUCING SOFT ERRORS IN INTEGRATED CIRCUITS

This application claims priority under 35 USC §119(e)(1) of provisional application No. 60/092,729 filed Jul. 14, 1998.

TECHNICAL FIELD OF THE INVENTION

The present invention relates in general to the field of integrated circuit manufacturing, and more particularly, to utilizing deep trench isolation for reducing soft errors in integrated circuits.

BACKGROUND OF THE INVENTION

Without limiting the scope of the invention, its background is described in connection with the manufacture of integrated circuits for use in the creation of metal oxide semiconductor (MOS) memory devices, as an example.

The growing demand for increasingly smaller and thus more cost effective semiconductor devices, e.g., with large memory capacities, has pushed the development of miniaturized structures in sub-micron technologies. The development of dynamic random access memory (DRAMs) has made possible the storage capability of several million bits of information in a single integrated circuit chip. DRAMs are memory devices in which the presence or absence of a capacitive charge represents the state of binary storage element. DRAMs, which are capable of inputting and outputting data at random, generally comprise an array of memory cells for storing data and peripheral circuits for controlling data in the memory cells. Within the array, each memory cell is electrically isolated from adjacent cells.

Typically, a MOS DRAM cell includes a single transistor and a single capacitor for storing the electrical charge corresponding to one bit of information; the cell operates by storing a charge on the capacitor for a logic 1 and storing no charge for a logic 0. With such a construction, each cell of the memory array is required to be periodically refreshed so as to maintain the logic level stored on the cell capacitor. The greater the current leakage, the more frequent the refresh cycle.

SUMMARY OF THE INVENTION

It has been found, however, that present methods for the development of large monolithic circuits have encountered numerous difficulties. One such difficulty is the problem of shrinking size in order to pack more circuitry on a chip without increasing the soft error rate. As the size of DRAM arrays, for example, is decreased, the density of the integrated circuits within the DRAM arrays is correspondingly increased. Therefore, the potential grows larger for the occurrence of soft errors caused by charges injected from the surroundings, making the device less reliable.

Such soft errors in DRAM cells have also been attributed to the vulnerability of MOS capacitors to charges generated in the substrate by ionizing radiation such as cosmic rays, noise injected from the substrate, p-n junction leakage over the entire area of the capacitor, and sub-threshold leakage of the cell transistor. A cosmic ray, for example may directly or indirectly produce an ionization path. In fact, a 5 MeV alpha particle can produce more than 200 femtocoulombs of hazardous electrons.

What is needed is a high density integrated circuit that reduces the incidence of soft errors. The present invention disclosed herein provides an integrated circuit having improved soft error protection and a method improving the soft error protection of an integrated circuit. The integrated circuit can comprise a substrate, a transistor formed in the substrate, a first region formed in the substrate having a first conductivity type, a second region below the first region having a second conductivity type, and a trench formed in the substrate having a depth at least substantially as deep as the first region. The trench is filled with a non-conductive material that forms a frame around the transistor, whereby soft errors due to electron hole pairs caused by ionizing radiation in the frame area are substantially eliminated.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
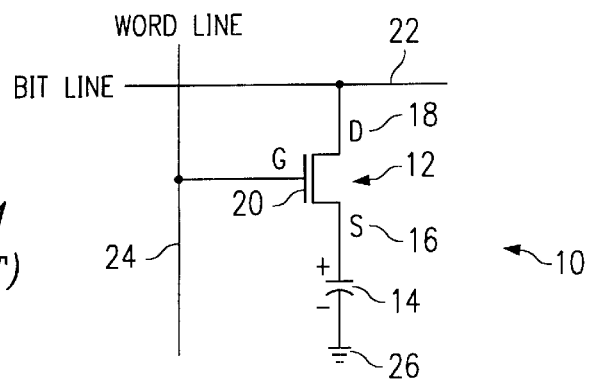
FIG. 1 is a schematic diagram of a DRAM cell.

Turning now to the schematic diagram of FIG. 1, a typical prior art DRAM cell 10 includes a transistor 12 and a capacitor 14. Transistor 12 includes a source 16, a drain 18 and a gate 20. Source 16 is connected to capacitor 14. Drain 18 is connected to a bit line 22. Gate 20 is connected to a word line 24. Transistor 12 is suitable for use as a metal oxide semiconductor field effect transistor (MOSFET).

Capacitor 14 is also connected to ground 26 on the end opposite source 16. Capacitor 14 stores charge to represent a bit of information. For example, if no charge is stored by capacitor 14, this could represent a logic 0. Similarly, if charge is stored by capacitor 14 corresponding to a potential of, for example, 5 V across the capacitor plates, this could represent a logic 1.

The bit of information is accessed to read or write by applying a voltage on word line 24 to turn on transistor 12. Once turned on, transistor 12 connects capacitor 14 to bit line 22 for the read and write operations. Word line 24 is then generally returned to a ground level voltage to turn off transistor 12.

Charge on capacitor 14 may, however, slowly leak away due to inherent leakage currents. In operating DRAMs, it is therefore necessary to periodically refresh the device by rewriting the stored data on a bit by bit basis to each of the DRAM cells such as DRAM cell 10. The greater the current leakage, the higher the frequency of such rewriting.

Figure 2:
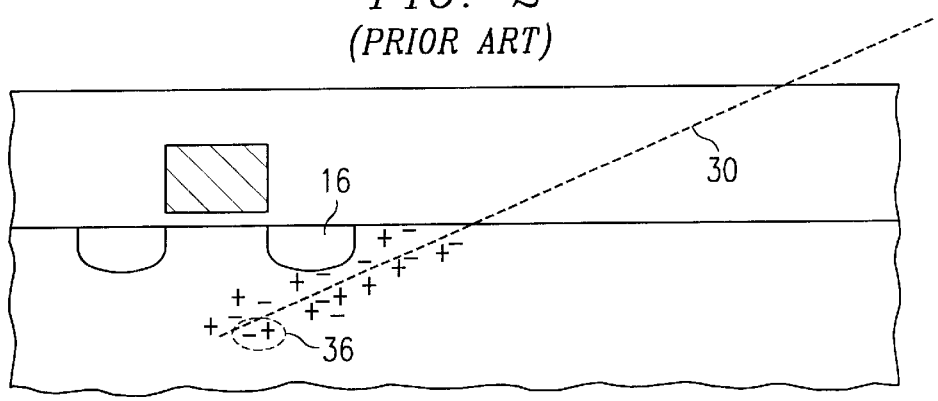
FIG. 2 is a depiction of the introduction of particles into a semiconductor device.

Additionally, capacitor 14 is vulnerable to charges generated in the substrate by cosmic rays, noise injected from the substrate, p-n junction leakage over the entire area of capacitor 14, and sub-threshold leakage of transistor 12. As depicted in FIG. 2 (prior art), a particle 30, e.g., generated by a cosmic ray can be introduced into the device. For example, as a result of particle 30, such as an alpha particle, transistor source ("storage node") 16 may be partially or completely shorted to ground, and the capacitor 14 (of FIG. 1) at least partially discharged.

Electron-hole pairs 36 are created as particles 30 traverse the silicon lattice. Typically, there exists approximately one electron-hole pair 36 per 3.6 eV. In a positively charged source 16, for example, the electrons, being attracted by the electric field, go to such a source, thus depleting the charge. Similarly, if a source/drain is negatively charged, holes will migrate to such a source/drain and at least partially deplete its charge. Such depletion effects transient errors, called soft errors, and may result in a false logic 0 rather than a logic 1.

Figure 3:
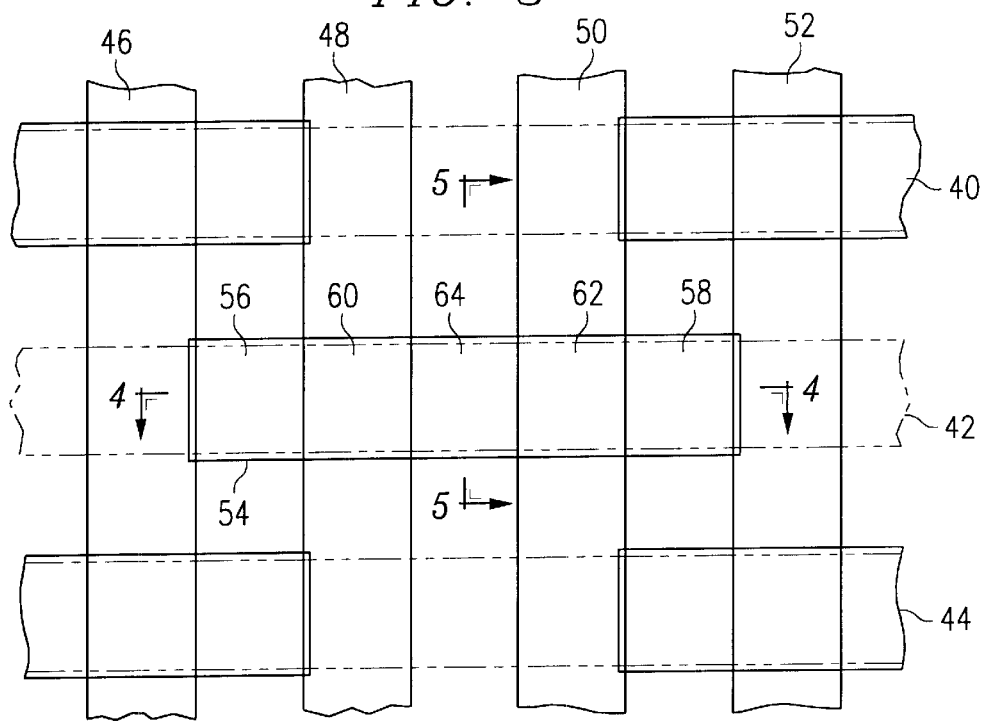
FIG. 3 is plan view of a portion of a DRAM array.

Turning now to FIG. 3, a plan view of a portion of a DRAM array is shown. Bit lines 40, 42, and 44 pass under word lines 46, 48, 50, and 52. While bit lines 40, 42, and 44 and word lines 46, 48, 50, and 52 are shown as perpendicular lines for ease of illustration, they may be curved or angled or take on various other configurations. Region 54, which may sometimes be referred to as a moat, encompasses a pair of DRAM cells sharing a common bit line contact 64. In such a configuration, region 54 comprises storage nodes 56 and 58, gates 60 and 62, and a bit line contact 64. Gates 60 and 62 are word line contacts to word lines 48 and 50, respectively.

Figure 4:
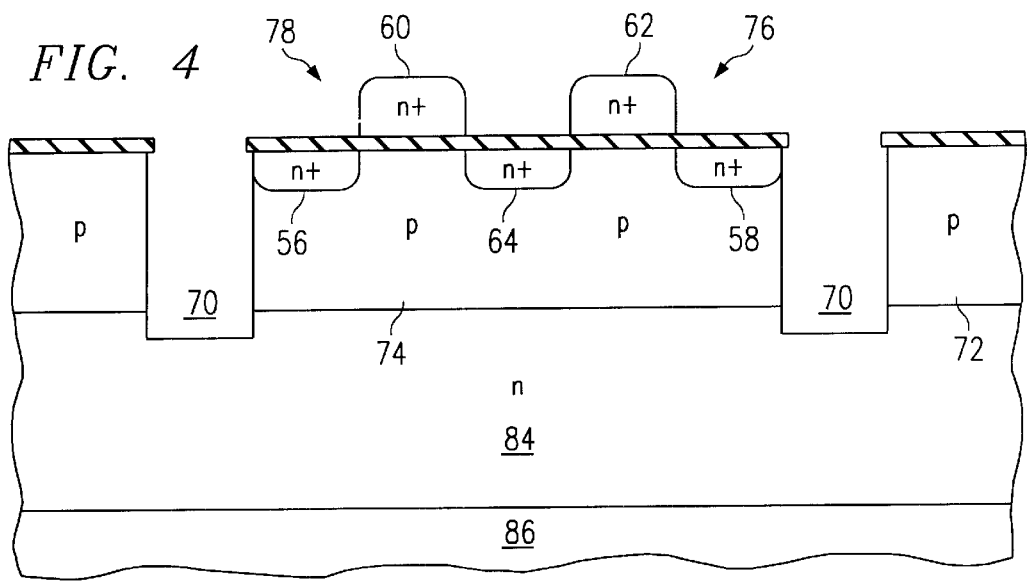
FIG. 4 is a cross-sectional view of a portion of the DRAM array taken along line 4—4 of FIG. 3.
Figure 5:
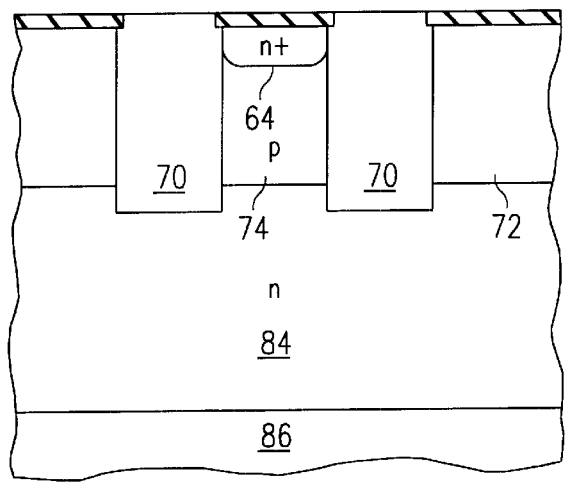
FIG. 5 is a cross-sectional view of a portion of the DRAM array taken along line 5—5 of FIG. 3.
Figure 6:
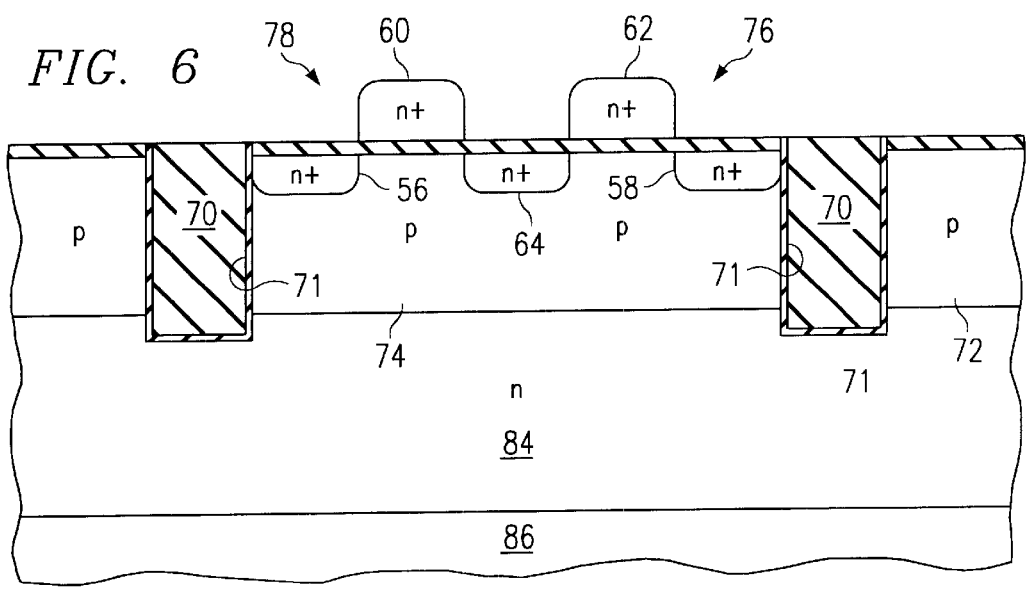
FIG. 6 is a cross-sectional view of a portion of the DRAM array.

The features of one embodiment of the present invention may be best understood with reference to FIGS. 4–6. FIGS. 4 and 5 depict cross-sectional views of portions of the DRAM array of FIG. 3 taken along lines 4—4 and 5—5, respectively. It should be noted that the features of the present invention may be used for either n-channel, p-channel, or both types of devices. For the convenience of illustration, however, the following description refers to deep trench isolation with respect to a dual n-channel circuit with n$^+$ doped sources and drains. It should nevertheless be appreciated by one skilled in the art that the features of the present invention are not limited to devices of any one particular conductivity.

As shown in FIGS. 4 and 5, trench 70 is formed in substrate 72 for physically and electrically isolating p-region 74, which may be lightly doped. The depth of p-region 74 may be, for example, a shallow depth of approximately 1.5$\mu$ to approximately 2.0$\mu$. As shown in FIG. 4 and 5, trench 70 is vertically deeper than p-region 74, and penetrates deep n well 84. Below deep n well 84 is p substrate 86.

Memory cells 76 and 78 comprise storage nodes 56 and 58, gates 60 and 62, a shared drain (common bit line contact 64), and capacitors (not shown). Storage nodes 56 and 58 and bit line contact 64 are each heavily doped (n$^+$). A capacitor (not shown) is formed over and electrically connected to each of the storage nodes 56 and 58.

Trench 70 is formed utilizing conventional lithographic techniques. Trench 70 is first defined by forming a photoresist layer on substrate 72, and utilizing a photomask, which forms the pattern of apertures for trenches 70. The substrate 72 is then subjected to an anisotropic etch, such as a plasma reactive ion etch, to remove semiconductor material to form trench 70. The anisotropic etch is preferably continued until such time that trench 70 penetrates deep n well 84. After the photoresist layer is removed, a plasma deposition can be used to fill trench 70 with an electrically non-conductive material such as $SiO_2$, $Si_3N_4$ or silicon oxynitride.

Trench 70 is etched to a depth so as to penetrate deep n well 84, thus completely isolating p-region 74 when filled with a non-conductive material 71, as shown in FIG. 6. Trench 70 thus frames p-region 74 and acts as an insulative barrier against unwanted charges in either the trench or outside the frame. The use of deep trench isolation therefore provides improved immunity against soft errors. Additionally, the use of deep trench isolation limits the (e.g. electron) diffusion to storage nodes 56 and 58.

Figure 7:
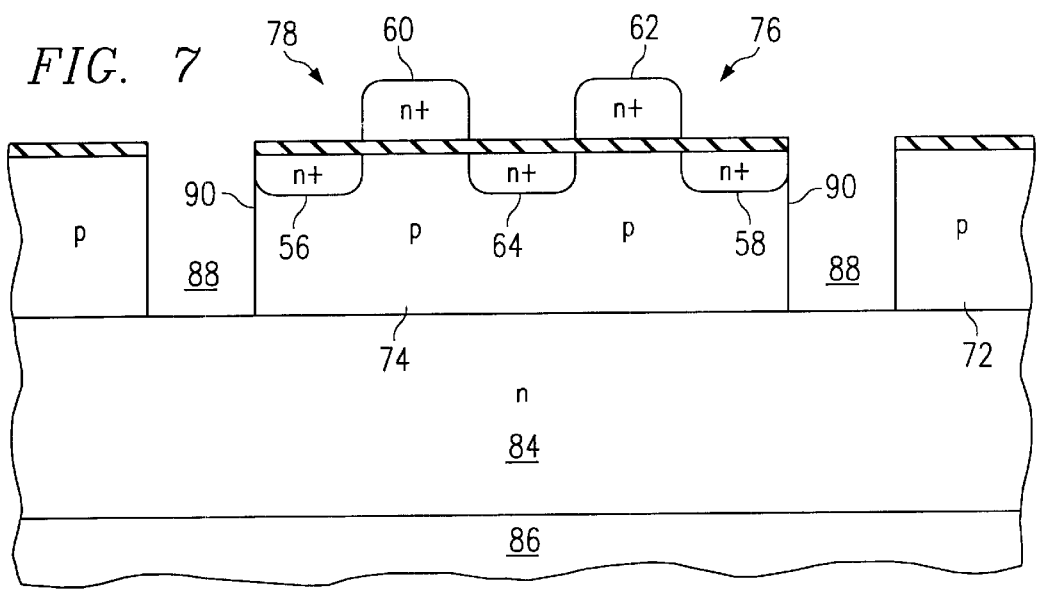
FIG. 7 is a cross-sectional view of a portion of a DRAM array in accordance with one embodiment of the present invention.
Figure 8:
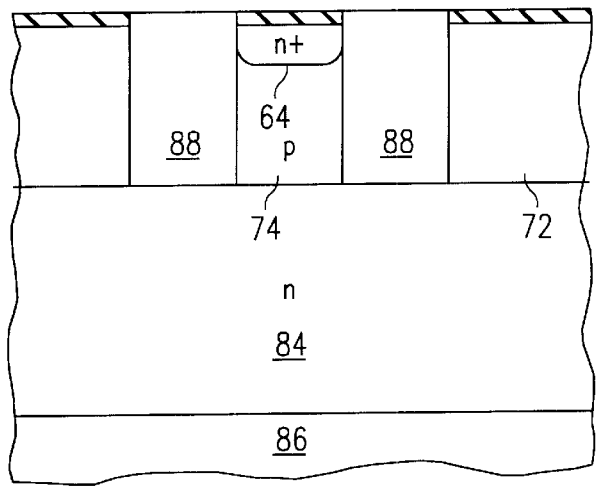
FIG. 8 is a cross-sectional view of a portion of the DRAM array of FIG. 7 in accordance with one embodiment of the present invention.
Figure 9:
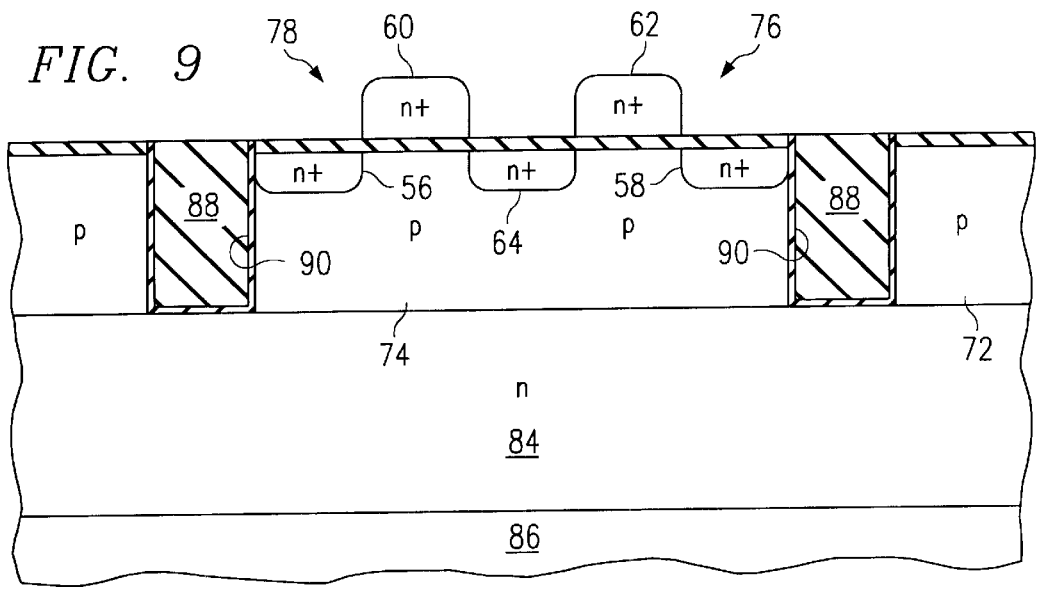
FIG. 9 is a cross-sectional view of a portion of the DRAM array of FIG. 7 in accordance with one embodiment of the present invention.

Turning now to FIGS. 7–9, another embodiment of the present invention is depicted. As shown in FIGS. 7 and 8, trench 88 is etched into p-region 74 to meet deep n well 84. In such a configuration, trench 88 is etched to a depth equal to the depth of p-region 74 to frame p-region 74 and serve as an effective insulative barrier against carriers generated by alpha and other ionizing particles.

Trench 88 is formed in substrate 72 for physically and electrically isolating p-region 74 which may be lightly doped. The depth of p-region 74 may be, for example, a shallow depth of approximately 1.5$\mu$ to approximately 2.0$\mu$. As shown in FIGS. 7 and 8, trench 88 is as deep as the bottom of p-region 74.

Memory cells 76 and 78 comprise storage nodes 56 and 58, gates 60 and 62, a common bit line contact 64, and capacitors (not shown). Storage nodes 56 and 58 and bit line contact 64 are each heavily doped (n$^+$). Capacitors would again be formed over storage nodes 56 and 58.

Trench 88 is formed utilizing conventional lithographic techniques. Trench 88 is first defined by forming a photoresist layer on substrate 72, and utilizing a photomask to pattern trench 88. The substrate is then subjected to an anisotropic etch, such as a plasma reactive ion etch, to remove the semiconductor material and form trench 88. The anisotropic etch is continued until such time that trench 88 is as deep as p-region 74 and meets deep n well 84. A thin field oxide 90 can then be grown on substrate the walls of trench 88, as shown in FIG. 9. A plasma deposition can be used to fill trench 88 with an electrically non-conductive material.

Figure 10:
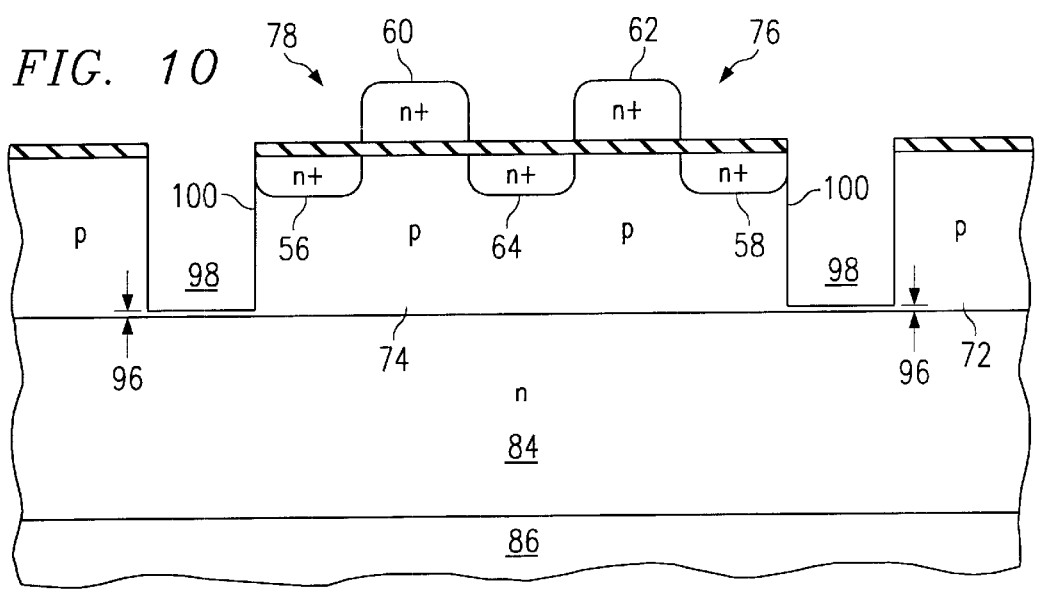
FIG. 10 is a cross-sectional view of a portion of a DRAM array in accordance with one embodiment of the present invention.
Figure 11:
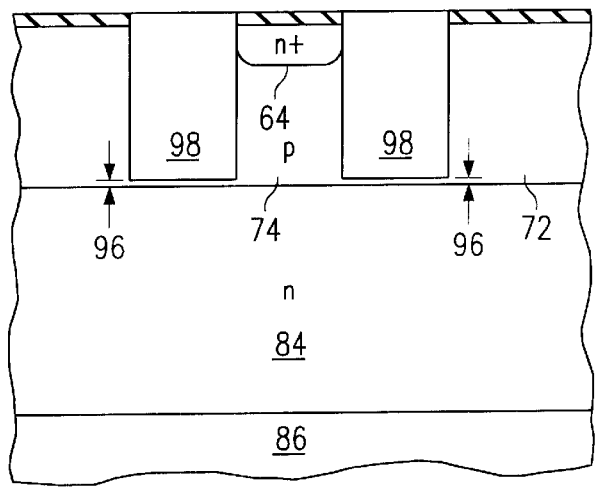
FIG. 11 is a cross-sectional view of a portion of the DRAM array of FIG. 10 in accordance with one embodiment of the present invention.
Figure 12:
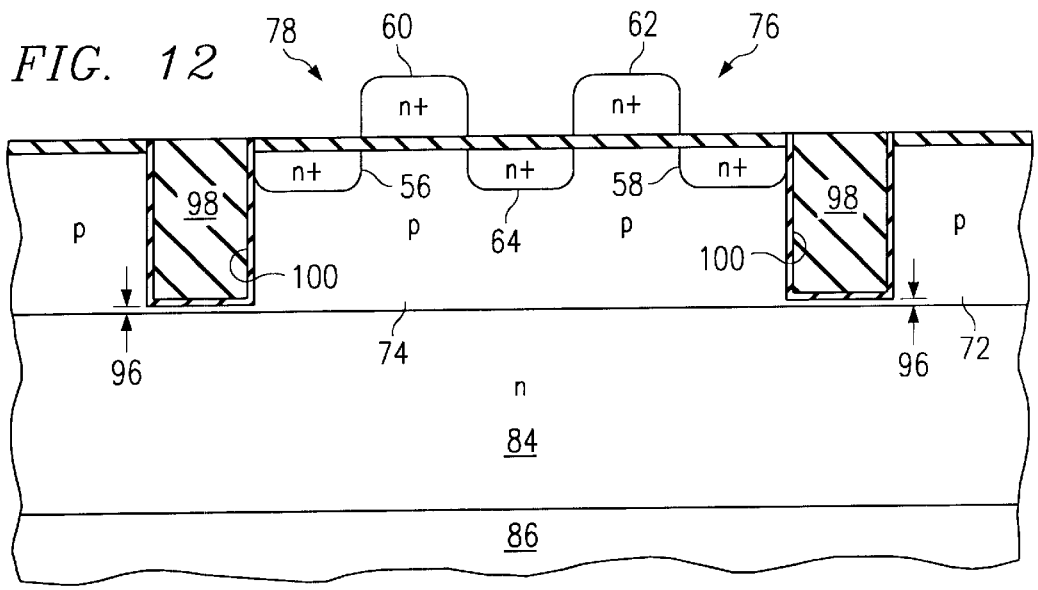
FIG. 12 is a cross-sectional view of a portion of the DRAM array of FIG. 10 in accordance with one embodiment of the present invention.

Turning now to FIGS. 10–12, yet another embodiment of the present invention is depicted. As shown in FIGS. 10 and 11, trench 98 is etched into p-region 74 leaving a narrow gap 96 of p-region 74 between the floor of trench 98 and deep n well 84. In such a configuration, trench 98 is etched to a depth substantially near the depth of p-region 74 to frame p-region 74 and serve as an effective insulative barrier against carriers generated by alpha and other ionizing particles.

Trench 98 is formed in substrate 72 for physically and electrically isolating p-region 74 which may be lightly doped. The depth of p-region 74 may be, for example, a shallow depth of approximately $1.5\mu$ to approximately $2.0\mu$. As shown in FIGS. 10 and 11, trench 98 is nearly as deep as the bottom of p-region 74.

Memory cells 76 and 78 comprise storage nodes 56 and 58, gates 60 and 62, a common bit line contact 64, and capacitors (not shown). Storage nodes 56 and 58 and bit line contact 64 are each heavily doped ($n^+$). Capacitors would again be formed over storage nodes 56 and 58.

Trench 98 is formed utilizing conventional lithographic techniques. Trench 98 is first defined by forming a photoresist layer on substrate 72, and utilizing a photomask to pattern trench 98. The substrate is then subjected to an anisotropic etch, such as a plasma reactive ion etch, to remove the semiconductor material and form trench 98. The anisotropic etch is continued until such time that trench 98 is nearly as deep as p-region 74 and approaches deep n well 84. A thin field oxide 100 can then be grown on substrate the walls of trench 98, as shown in FIG. 12. A plasma deposition can be used to fill trench 98 with an electrically non-conductive material.

It should be noted that the DRAM cells of the present invention may be implemented using either p-channel or n-channel transistors. The conductivity type of the source and drain regions governs the conductivity type of the polycrystalline silicon used as the capacitor electrode. In addition, while DRAMs have been used herein to illustrate the features of the present invention, it should be appreciated by one skilled in the art that soft errors occur in many types of semiconductor devices, and that the principles of the present invention are thus wholly applicable to many other types of circuits including an embedded memory in a logic device, for example.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit having improved soft error protection comprising:
    a substrate;
    a first region of said substrate having a first conductivity type;
    a pair of transistors having one of a common source or drain, each transistor of said pair of transistors also having the other of a source or a drain, said pair of transistors disposed in a first portion of said first region;
    a second region below said first region having a second conductivity type different from said first conductivity type; and
    a trench filled with an electrically non-conductive material sufficient to substantially eliminate soft errors due to electron hole pairs caused by ionizing radiation emanating external to said trench disposed in and extending entirely through said first region and at least to said second region and entirely surrounding said pair of transistors within said first region to isolate said pair of transistors from other portions of said first region external to said first portion.

2. The integrated circuit as recited in claim 1 wherein said trench penetrates said second region.

3. The integrated circuit as recited in claim 1 wherein the vertical distance between said second region and the floor of said trench is zero.

4. The integrated circuit as recited in claim 1 wherein the vertical distance between said second region and the floor of said trench extends below said first region.

5. The integrated circuit as recited in claim 1 wherein said first region is substantially adjacent to said second region.

6. The integrated circuit as recited in claim 1 wherein said trench is filled with a non-conductive material.

7. The integrated circuit as recited in claim 6 wherein said non-conductive material is selected from the group consisting of $SiO_2$, $Si_3N_4$ and silicon oxynitride.

8. The integrated circuit as recited in claim 1 wherein said first region is lightly p-doped.

9. The integrated circuit as recited in claim 1 wherein said transistors are part of a memory circuit.

10. The integrated circuit as recited in claim 9 wherein said memory circuit is an embedded memory in a logic device.

11. The integrated circuit as recited in claim 9 wherein said memory circuit is a memory cell in a DRAM.

12. The integrated circuit as recited in claim 1 wherein said transistors are field effect transistors.

13. The integrated circuit as recited in claim 1 further comprising a separate capacitor having a first plate electrically connected to one of a source or drain of each of said pair of transistors.

14. An integrated circuit having improved soft error protection comprising:
    a substrate;
    a well disposed in said substrate having a depth and having a first conductivity type;
    a pair of transistors having one of a common source or drain, each transistor of said pair of transistors also having the other of a source or a drain, said pair of transistors disposed in said well;
    a substrate region below said well having a second conductivity type different from said first conductivity type; and
    a trench filled with an electrically non-conductive material sufficient to substantially eliminate soft errors due to electron hole pairs caused by ionizing radiation emanating external to said trench disposed in said well, extending entirely through said well and having a depth greater than the depth of said well, said trench completely surrounding said pair of transistors within said well and electrically isolating said pair of transistors from the remainder of said well.

15. The integrated circuit as recited in claim 14 wherein said trench penetrates said well.

16. The integrated circuit as recited in claim 14 wherein the vertical distance between said well and the floor of said trench is zero.

17. The integrated circuit as recited in claim 14 wherein the vertical distance between said well and the floor of said trench extends into said substrate.

18. The integrated circuit as recited in claim 14 wherein said well is substantially adjacent to said substrate region.

19. The integrated circuit as recited in claim 14 wherein said non-conductive material is selected from the group consisting of $SiO_2$, $Si_3N_4$ and silicon oxynitride.

20. The integrated circuit as recited in claim 14 wherein said well is lightly p-doped.

21. The integrated circuit as recited in claim 14 wherein said transistors is a part of a memory circuit.

22. The integrated circuit as recited in claim 21 wherein said memory circuit is an embedded memory in a logic device.

23. The integrated circuit as recited in claim 21 wherein said memory circuit is a memory cell in a DRAM.

24. The integrated circuit as recited in claim 14 wherein said pair of transistors are field effect transistors.

25. The integrated circuit as recited in claim 14 further comprising a separate capacitor having a first plate electrically connected to one of a source or drain of each of said pair of transistors.

* * * * *